United States Patent [19]

Pascal et al.

[11] 4,434,547
[45] Mar. 6, 1984

[54] PROCESS FOR THE MANUFACTURE AND ADJUSTMENT OF A JOSEPHSON EFFECT MAGNETIC FLUX PICK-UP

[75] Inventors: Daniel Pascal, Orsay; Denis Duret, Grenoble, both of France

[73] Assignee: Commissariat a l'Energie Atomique, Paris, France

[21] Appl. No.: 323,534

[22] Filed: Apr. 29, 1981

[30] Foreign Application Priority Data

May 5, 1980 [FR] France ............................ 80 09968

[51] Int. Cl.³ ........................................... H01L 39/24
[52] U.S. Cl. ........................................ 29/599; 357/5
[58] Field of Search ............................. 29/599; 357/5

[56] References Cited

U.S. PATENT DOCUMENTS

| | | | |
|---|---|---|---|
| 4,025,844 | 5/1977 | Deutscher | 357/5 |
| 4,064,029 | 12/1977 | Wu et al. | 29/599 |
| 4,255,465 | 3/1981 | Bernard et al. | 29/599 |

FOREIGN PATENT DOCUMENTS

| | | | |
|---|---|---|---|
| 7331061 | 4/1975 | France | |
| 52-69297 | 6/1977 | Japan | 357/5 |

OTHER PUBLICATIONS

P. W. Anderson and A. H. Dayem, Radio-Frequency Effects in Superconducting Thin Film Bridges, 8/10/1964, pp. 195-197.

Primary Examiner—Francis S. Husar
Assistant Examiner—David B. Jones
Attorney, Agent, or Firm—Kerkam, Stowell, Kondracki & Clarke

[57] ABSTRACT

The invention relates to a process for the manufacture and adjustment of a Josephson effect magnetic flux pick-up. This process comprises depositing a thin, uniform layer (1) of a superconducting material on a cylindrical insulating bar (2) having an axis and a cylindrical surface, then making a cut (5) through the layer of superconducting material on a line along the cylindrical surface of the cylindrical bar (2), which line is parallel to the axis of the cylindrical bar, while leaving a bridge (7) between two edges of the layer of superconducting material defined by the cut, then subjecting the pickup thus manufactured to pulses for adjustment of the critical current, by induction, and in measuring, by induction, the parameters of the pick-up.

15 Claims, 3 Drawing Figures

PROCESS FOR THE MANUFACTURE AND ADJUSTMENT OF A JOSEPHSON EFFECT MAGNETIC FLUX PICK-UP

The present invention relates to a process for manufacturing and adjusting a Josephson effect magnetic flux pick-up. It is applied to the manufacture and adjustment of a Josephson effect magnetic flux pick-up, of SQUID type ("Superconducting Quantum Interference Device", which corresponds to French term "Dispositif supr aconducteur a interference quantique"). This pick-up, which has the form of a superconducting ring and which will be described in detail hereinafter, is used for measuring magnetic flux. A direct application is the measurement of a magnetic induction (biomagnetism or geomagnetism). This pick-up may also be used indirectly in the measurement of voltages and currents. In this case, the voltage is applied to an inductance coupled to the SQUID; it is also possible to pass the current to be measured into the inductance, which produces a flux which is picked up by the SQUID. Another indirect application of the pick-up is the measurement of the temperatures by evaluation of the noise of thermal origin appearing at the terminals of a resistor.

It is known that a Josephson effect magnetic pick-up, of "SQUID" type, is constituted by a Josephson effect junction presenting a critical current $I_c$, inserted in a superconducting ring of self-inductance L; this pick-up is cooled to very low temperature. Its good functioning involves that the product $L \times I_c$ be of the order of size of the flux quantum $\phi_o = 2.10^{-15}$ Wb. In this relation, $\phi_o = h/2e$, h is the Planck constant and e the charge of the electron. Generally, these pick-ups present an inductance L close to 0.5 nH and a critical current of a few $\mu A$. A pick-up of this type is described in the journal RSI- volume 46, No. 4, April 1975, pages 474 to 480.

However, there are a large number of SQUID type pick-ups using a Josephson junction. These pick-ups may be classified in two categories:

the solid SQUIDS, in which the material used in generally niobium, the ring being made by piercing one or more holes of cylindrical form or of toric form, in a solid block. The Josephson junction is generally presented in the form of a niobium prod contact abutting on a plate made in the solid block. SQUIDS of this type are described in the article by J. E. Zimmerman, which appeared in the journal "Cryogenics", vol. 12, No. 1, February 1972. the drawbacks of such pick-ups result from their size; in fact, their diameter is often larger than a centimetre. These drawbacks also result from their production costs, as production requires precision mechanics. Finally, they result from the instability of the junction at the thermal cycles.

the thin layer SQUIDS, in which the material used is generally niobium, but may also be lead, tin, superconducting alloys, . . . . The superconducting ring in this case is constituted by a thin layer having a thickness of about 1000 Å, deposited under ultrahigh vacuum, on a cylindrical or plane insulating support, which may be constituted by quartz, but which may also be constituted by a sapphire, by glass, etc. . . . . The Josephson junction is often in the form of a Dayem microbridge or a Notarys microbridge; sometimes, this junction is a tunnel junction.

The Dayem junction is constituted by two superconducting films of small thickness (500 Å), connected together by a constriction, or microbridge, of small dimensions ($1\mu \times 1\mu$). The stability of the SQUIDS with Dayem junction is excellent, but this junction is difficult to make. In fact, it is at present very difficult to make in reproducible manner a microbridge having very small dimensions by conventional techniques: photomasking or mechanical masking. The known solutions do not make it possible to obtain microbridges having well defined characteristics and in particular Josephson critical currents, defined with good precision.

The Notarys microbridge, which is a variant of the Dayem microbridge, uses the proximity effect; in this case, a longer ($25\mu$) and wider ($4\mu$) junction is made and a band of non-superconducting material which may have a fairly considerable length but a width of $1\mu$ is then deposited, perpendicularly to this microbridge. The deposit of this material is very difficult to effect.

It results from these observations that the thin layer SQUIDS which use junctions of "Dayem microbridge" or "Notarys microbridge" type are difficult to make, reproduce and that their manufacture involves considerable waste.

However, the technique has gradually turned towards the manufacture of Josephson effect magnetic flux pick-ups (or SQUID) with thin layers. In fact, the solid SQUIDS have too much instability. It has thus been possible to develop a process for manufacturing Josephson effect magnetic flux pick-ups, proceeding in the following manner:

1. Firstly, a deposit is made in an ultra-high vacuum chamber of a layer of about 1000 Å of niobium on a quartz bar with a diameter of 2 mm and a length of about 20 cm. This layer of niobium is then covered with a layer of gold also having a thickness of about 1000 Å.

2. The quartz bar thus covered is then sectioned into a plurality of pieces which are coated with photosensitive resin. Each of the bars is then engraved, by photolithography and by chemical attack, so as to obtain a microbridge on a generatrix of each cylindrical piece and an opening of the opposite genetratrix of the piece in question is made. Four wires are then welded to the terminals of the microbridge, which enables its current-voltage characteristics to be laid out and its critical current $I_c$ to be adjusted. Each piece thus obtained constitutes the blank of a Josephson effect magnetic flux pick-up; this blank is then immersed in a cooling liquid at very low temperature, such as liquid helium for example, and its critical current is measured. The microbridges thus constituted do not present the Josephson effect yet. The critical current is diminished to a value of between 5 and 10 $\mu A$ by a process such as the one described in the commonly assigned French Patent Application No. 73 31061 filed on Aug. 28, 1973 and which corresponds to U.S. Pat. No. 4,255,465. As described in this Patent, the critical current sought in the Josephson junction is obtained by applying to this junction taken to very low temperature, current pulses whose intensity and duration have a value which depends on the critical Josephson current which it is desired to obtain.

3. The Josephson pick-up whose critical current has thus been adjusted and whose layer of gold has been removed, is then removed from the chamber at very low temperature, and it is again placed in the ultra-high vacuum chamber in order to close it again by another thin layer of niobium, the open generatrix opposite the microbridge; this second evaporation does not cover the microbridge.

The main drawback of this known process is that it is very slow. In fact, the deposit of a layer of niobium requires 24 hours of pumping in the ultra-high vacuum chamber. Moreover, the junction of which the critical current has been reduced to 10 μA is fragile as long as it is not short-circuited by the additional layer of niobium; this layer protects the junction against the parasitic electric fields which may appear at its terminals. Moreover, the self-inductance L, which intervenes in the relation $L \cdot I_c \simeq \phi_o$ is, in reality, not htat of the pick-up finally constituted, but that of the pick-up before the deposit of the additional layer of niobium. This results in that the value of the self-inductance of the finally constituted pick-up and of which the critical current has been adjusted in the manner indicated hereinabove, is known only with a precision of 50%. Finally, the pick-ups thus obtained present characteristics which develop in time. In fact, the second deposit of niobium does not always adhere perfectly to the first layer, due to the natural oxide which may form, due to the chemical pollutions during handling, and also due to the temperature of the substrate which is lower during deposit of the second niobium layer. This results in that the manufacture of pick-ups according to this process presents considerable waste and these pick-ups present a certain disparity in their characteristics.

It is an object of the present invention to remedy these drawbacks and in particular to simplify the process of manufacturing Josephson effect magnetic flux pick-ups, in the form of thin layer SQUIDS. It is a further object to simplify the adjustment of the critical current $I_c$, knowing that the value of the self-inductance L of the pick-up remains constant and the product $L \cdot I_c$ is known with good precision. Finally, it makes it possible to manufacture Josephson effect pick-ups whose characteristics are reproducible, without this manufacture involving considerable waste. As will be seen hereinafter, the first step (successive deposits) of the process described hereinabove remains unchanged, whilst the second step (engraving and adjustment of the critical current) is simplified and the third step (closure of the circuit) is eliminated.

The invention essentially relates to a process for the manufacture and adjustment of a Josephson effect magnetic flux pick-up, comprising depositing a thin, uniform layer (1) of a superconducting material on a cylindrical insulating bar (2) having an axis and a cylindrical surface, then making a cut (5) through the layer of superconducting material on a line along the cylindrical surface of the cylindrical bar (2), which line is parallel to the axis of the cylindrical bar, while leaving a bridge (7) between two edges of the layer of superconducting material defined by the cut, then subjecting the pickup thus manufactured to pulses for adjustment of the critical current, by induction, and in measuring, by induction, the parameters of the pick-up.

According to another feature, the pulses for adjustment are applied to the pick-up via a primary coil which receives these pulses.

According to another feature, the measurement by induction of the parameters of the pick-up is effected via a secondary coil which surrounds the pick-up.

According to another feature, the measurement by induction further comprises mounting in opposition with the secondary coil which surrounds the pick-up, a secondary compensation coil identical to the secondary adjustment coil, these two secondary coils being connected to a coil for measuring the flux gradient between these two secondary coils.

According to another feature, a magnetometer is associated with the coil for measuring the flux gradient.

According to another feature, the pulses for adjustment by induction are pulses of which the frequency is in the radio-frequency range.

According to another feature, the pulses are applied to the pick-up in the form of successive pulse trains, the pulses of each train having increasing amplitudes.

According to another feature, the magnetometer which is associated with the measuring coil is a Josephson effect magnetometer.

According to another feature, a thin, uniform layer of a conducting material is deposited on the layer of superconducting material, the cut which leaves a bridge also being made in this layer.

According to another feature, the superconducting material is niobium and the conducting material is gold.

The invention will be more readily understood on reading the following description with reference to the accompanying drawings, in which.

Figure 1:
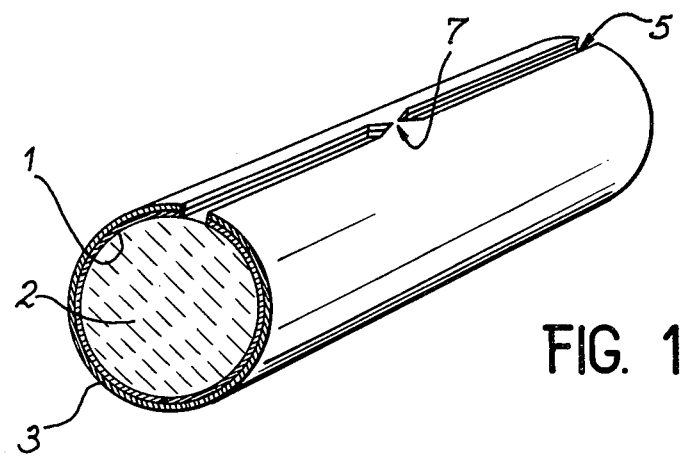
FIG. 1 shows a Josephson effect magnetic flux pick-up.

The pick-up shown in FIG. 1 is manufactured and adjusted according to the process of the invention. According to this process, a first thin, uniform layer 1, of a superconducting material such as niobium for example, is deposited on a cylindrical insulating bar 2 which may be constituted by quartz; a second thin, uniform layer 3 may possibly then be deposited on the first layer 1, said second layer being of a conducting material such as gold. These deposits are effected in known manner in an ultra-high vacuum chamber and the quartz bar has a diameter of 2 mm and a length of 20 cm for example, whilst the two layers of niobium and gold have a thickness of about 1000Å. The bar is long enough to allow the formation of several pick-ups, it is cut into a plurality of pieces; each of these pieces is coated with a photosensitive resin to make it possible, by photolithography and chemical attack, to make a cut 5 along a generatrix of the bar and up to this bar. On this generatrix is left or defined a bridge 7 between the two edges of the first and second layers. In other words, the cut 5 is made through the conducting layer 3 and the superconducting layer 1 on a line along the cylindrical surface of the insulating bar 2, this line being parallel to the axis of the bar 2, while leaving or defining the bridge 7 between the two edges of the layers 1 and 3 defined by the cut 5. The second layer 3 of conducting material is a protecting layer which may allow electrical contacts. These electrical contacts no longer serve for the use of the pick-up when its parameters are adjusted. After chemical etching of the microbridge and the cut, the layer 3 is withdrawn. The pick-up, once adjusted, is used by induction. The pick-up thus produced, but of which the critical current $I_c$ and the other parameters are not yet defined, is permanently closed by the superconducting layer 1. It is then placed in a fluid at very low temperature, such as liquid helium for example; $L \cdot I_c/\phi_o$ is measured and pulse trains are applied to the SQUID which reduce this ratio. The application of these pulses is ceased when $LI_c/\phi_o$ is of the order of 1. These pulses which have a frequency in radiofrequency range are applied thereto by induction.

Figure 2:
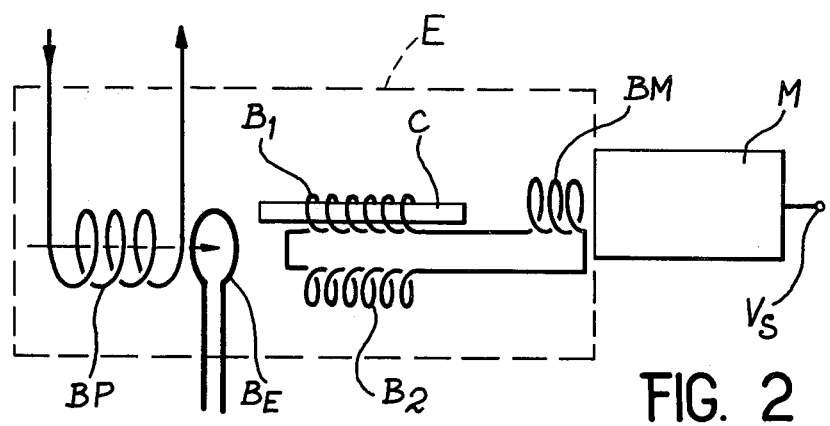
FIG. 2 shows a device which makes it possible, according to the process of the invention, to adjust the critical current in the flux pick-up and to measure, by induction, the parameters of this pick-up.

FIG. 2 shows the device which makes it possible to adjust the critical current of the pick-up by induction and to measure, by induction, the parameters of this pick-up. In this Figure, the pick-up of FIG. 1 is shown at C. The pulses for adjustment whose frequency is in the radiofrequency range are applied to the pick-up in the form of successive pulse trains; the pulses of each train present increasing amplitudes and are applied to the pick-up C, via a primary coil BP which receives these pulses. E represents the low temperature chamber (4.2° K. for example) in which is located the pick-up as well as the majority of the elements of the device which make it possible to adjust its critical current and measure its characteristic parameters. The pick-up is thus traversed by a pulsed induction flux. This flux may be determined perfectly since the frequency and amplitude of the pulses which are applied to the primary coil BP as well as the characteristics of this primary coil are known precisely. The measurement, by induction, of the parameters of the pick-up, is done by placing the pick-up in an adjustable secondary coil $B_1$ and in mounting opposition with this secondary coil $B_1$ which surrounds the pick-up C, a secondary compensation coil $B_2$, identical to the secondary coil for adjustment. The secondary coils are connected to a measurement coil BM which enables the flux gradient between the two secondary coils $B_1$ and $B_2$ to be measured. This flux gradient being due to the presence of the pick-up in the coil $B_1$. All of the coils BP, $B_1$, $B_2$ and BM are inductively coupled together, and thus flux from the primary coil BP influences both secondary coils $B_1$ and $B_2$. A Josephson effect magnetometer M is associated with the coil BM and enables this flux gradient to be measured as a function of a known low frequency flux, furnished by coil BE. This magnetometer delivers a voltage $V_s$ proportional to the product of the value of the self-inductance L by the current which passes through the pick-up. The product $LI_c$ is a characteristic of the pick-up and is equal to $\phi_o$ of $\phi_o$ value is adjusted to $\phi_o = h/2el = 2.07 \cdot 10^{-15}$ Wb; this results in that the magnetometer M enables the main parameters of the pick-up to be measured. In particular, knowing the value of $I_c$ makes it possible to obtain the value of L, which is an important parameter of the pickup C. This magnetometer is preferably a Josephson effect magnetometer as described in the article by John Clarke, which appeared in the journal "NATO Advanced Study Institutes Series", Series B, Physics, Vol. 2-1, 1977, pages 67–124. The primary coil BP receives pulse trains at a frequency of about 450 MHz, of increasing amplitude. These pulse trains are applied, by induction, to the pick-up C; each train lasts about 1 microsecond and is repeated four times per second, with an increasing amplitude, so that the electromagnic power presents a maximum of 8 watts. It is then observed that the critical current in the junction 7 diminishes; the application of the pulses to the primary coil BP ceases when the desired value of the product $LI_c$ and therefore the desired value of the critical current $I_c$ is attained. The value of the product $LI_c$ may be known, on the one hand by the output voltage $V_s$ of the magnetometer and, on the other hand, by the induction flux $\phi_a$ in the primary coil BP.

Figure 3:
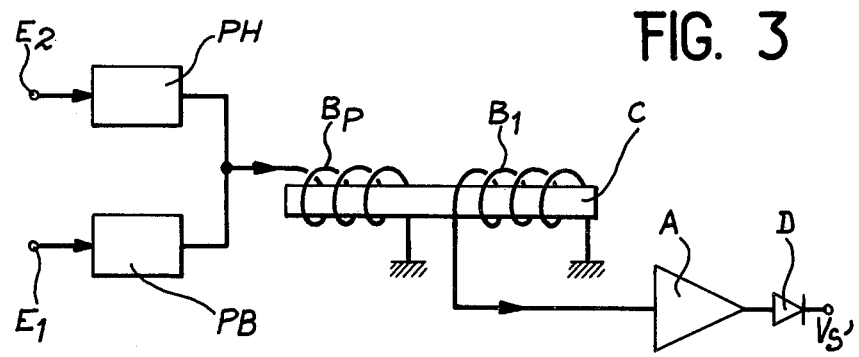
FIG. 3 shows another device which makes it possible, according to the process of the invention, to adjust the critical current in the flux pick-up.

FIG. 3 shows another device which, according to the process of the invention, makes it possible to adjust the critical current in the flux pick-up C and to measure its parameters in another manner.

This other device represents a practical simplification of the preceding one, but does not make it possible to immediately obtain parameter $LI_c$.

The pick-up of FIG. 1 is represented at C. The pulses for adjustment are applied in the smae manner as beforehand by the primary coil BP in which the pick-up is located.

The measurement by induction of the parameters of the pick-up comprises placing said latter in another coil $B_1$, coupled with a high gain amplifier A (20 MHz), followed by a detector D. The detected voltage is $V_s$. The pick-up is moreover excited at 20 MHz by an oscillator and via the coil BP. This oscillator is not shown, it is connected to the input $E_1$ of a low-pass filter PB, of which the output is connected to the coil BP. The ratio between the voltage $V_s$ and the output voltage of the oscillator is connected by a monotonic curve to the critical current of the pick-up. Knowledge of this curve makes it possible to know the value of the critical current (but not the value of the product $LI_c$, which assumes prior knowledge of the value of the self-inductance of the pick-up).

It suffices that the frequency of the oscillator be lower than that of the adjustment pulses (150 MHz) sent in the coil BP, via a high-pass filter PH, which receives these pulses on its input $E_2$.

The process for adjustment which has just been described is simpler and more rapid than known processes. It makes it possible to adjust the value of the critical current $I_c$ with high precision by adjusting the ratio $LI_c/\phi_o$. The adherence of the niobium on the quartz substrate is perfect and no additional layer of niobium is deposited. All the pick-ups thus adjusted are adjusted to the maximum of their performances, whatever the degree of knowledge of the value of the self-inductance L. The rate of waste is very low (lower than 10%) and it is essentially due to the incidents which may occur during the chemical etching of the cut.

The originality of the process of the invention comes from the fact that the critical current not only of the junction alone is adjusted, but that of the whole pick-up constituted by the junction and the superconducting ring to which this junction is connected. The pick-up does not receive a current pulse, but a train of radiofrequency waves of very short duration and, moreover, it remains permanently in the helium, whilst, in the state of the art, the pick-up was withdrawn from the liquid helium then reimmersed in the latter in the course of its elaboration and its adjustment. The value of the product $LI_c$ is measured due to the use of a differential transformer constituted by the two secondary coils $B_1$, $B_2$.

In the invention, the pulses which present a high frequency make it possible to induce the current necessary for the adjustment of the pick-up, despite its very low inductance (0.5 nH). At frequency of 450 MHz for example, the power applied to the pick-up is of the order of 8 watts. This frequency may of course vary between 10 MHz and 1 GHz.

It may have been thought that the fact of applying to the junction, by induction, pulses having periodically opposite polarities, could be without effect on the junction. In fact, it could be feared that the defects and crystalline rearrangement created in the junction for a first polarity of the pulses be eliminated by the pulses of a second polarity opposite the first polarity. There is no question of this.

We claim:

1. Process for manufacturing and adjusting a Josephson effect magnetic flux pick-up, comprising depositing a thin, uniform layer (1) of a superconducting material on a cylindrical insulating bar (2) having an axis and a cylindrical surface, then making a cut (5) through the layer of superconducting material on a line along the cylindrical surface of the cylindrical bar (2), which line is parallel to the axis of the cylindrical bar, while leaving a bridge (7) between two edges of the layer of superconducting material defined by the cut, then subjecting the pickup thus manufactured to pulses for adjustment of the critical current, by induction, and measuring, by induction, the parameters of the pick-up.

2. Process according to claim 1, characteristed in that the pulses for adjustment are applied to the pick-up via a primary coil (BP) which receives these pulses.

3. Process according to claim 1, characterised in that the measurement, by induction, of the parameters of the pick-up is effected via a secondary adjustment coil ($B_1$) which surrounds the pick-up.

4. Process according to claim 3, characterised in that the measurement by induction further comprises mounting in opposition with the secondary coil ($B_1$) which surrounds the pick-up, a secondary compensation coil ($B_2$) identical to the secondary adjustment coil, these two secondary coils being connected to a measurement coil (BM), for measuring the flux gradient between these two secondary coils.

5. Process according to claim 4, characterised in that a magnetometer (M) is associated with the cooil (BM) for measuring the flux gradient.

6. Process according to claim 3, characterised in that, for measuring the product $LI_c$, the pick-up is subjected to a magnetic flux at very low frequency.

7. Process according to claim 2, characterised in that the pulses for adjustment by induction are pulses whose frequency is in the radiofrequency range.

8. Process according to claim 7, characterised in that pulses are applied to the pick-up in the form of successive pulse trains, the pulses of each train presenting increasing amplitudes.

9. Process according to claim 5, characterised in that the magnetometer (M) which is associated with the measurement coil is a Josephson effect magnetometer.

10. Process according to claim 2 characterised in that, to adjust the critical current and measure the parameters of the pick-up, there is applied to the primary coil BP an electric wave of frequency lower than that of the adjustment pulses, then the output signal of the coil $B_1$ is amplified to the frequency of said electric wave and the amplitude variations of the signal amplified to the frequency of the electric wave are measured.

11. Process according to claim 10, characterised in that a thin, uniform layer (3) of a conducting material is deposited on the layer (1) of superconducting material, the cut (5) also being made through the layer of conducting material.

12. Process according to claim 11, characterised in that the superconducting material is niobium and the conducting material is gold.

13. Process according to claim 3, characterised in that, to adjust the critical current and measure the parameters of the pick-up, there is applied to the primary coil BP an electric wave of frequency lower than that of the adjustment pulses, then the output signal of the coil $B_1$ is amplified to the frequency of said electric wave and the amplitude variations of the signal amplified to the frequency of the electric wave are measured.

14. Process according to claim 13, characterised in that a thin, uniform layer (3) of a conducting material is deposited on the layer (1) of superconducting material, the cut (5) also being made through the layer of conducting material.

15. Process according to claim 14, characterised in that the superconducting material is niobium and the conducting material is gold.

* * * * *